(12) United States Patent
Markle et al.

(10) Patent No.: US 10,983,389 B2
(45) Date of Patent: Apr. 20, 2021

(54) WIRE GRID POLARIZER MANUFACTURING METHOD

(71) Applicant: Applied Materials, Inc., Santa Clara, CA (US)

(72) Inventors: David Markle, Pleasanton, CA (US); Jang Fung Chen, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 214 days.

(21) Appl. No.: 16/076,677

(22) PCT Filed: Feb. 10, 2017

(86) PCT No.: PCT/US2017/017319
§ 371 (c)(1),
(2) Date: Aug. 8, 2018

(87) PCT Pub. No.: WO2017/151291
PCT Pub. Date: Sep. 8, 2017

(65) Prior Publication Data
US 2019/0049789 A1    Feb. 14, 2019

Related U.S. Application Data

(60) Provisional application No. 62/303,969, filed on Mar. 4, 2016, provisional application No. 62/401,451, filed on Sep. 29, 2016.

(51) Int. Cl.
*G02F 1/1335*     (2006.01)
*G03F 7/00*       (2006.01)
(Continued)

(52) U.S. Cl.
CPC .......... *G02F 1/133528* (2013.01); *G02B 1/11* (2013.01); *G02B 5/3058* (2013.01);
(Continued)

(58) Field of Classification Search
CPC ........ G02B 1/04; G02B 5/3033; G02B 1/105; G02B 1/14; G02B 5/3083; G02B 5/30;
(Continued)

(56) References Cited

U.S. PATENT DOCUMENTS 5,266,790 A    11/1993   Markle et al.
5,402,205 A     3/1995   Markle et al.
(Continued)

FOREIGN PATENT DOCUMENTS

CN    104011597 A    8/2014
CN    105308507 A    2/2016
(Continued)

OTHER PUBLICATIONS

International Search Report and Written Opinion dated Apr. 25, 2017 for Application No. PCT/US2017/017319.
(Continued)

*Primary Examiner* — Collin X Beatty
*Assistant Examiner* — Grant A Gagnon
(74) *Attorney, Agent, or Firm* — Patterson + Sheridan LLP

(57) ABSTRACT

The present disclosure generally relates to systems and methods for manufacturing wire grid polarizers for LCDs using interference lithography, which are also useful for generating large-area grating patterns. In one embodiment, a method includes depositing a bottom anti-reflective coating layer over an aluminum coated flat panel display substrate, depositing a photoresist layer over the bottom anti-reflective coating layer, and exposing the photoresist layer with an image from a phase grating mask. The exposure with the phase grating mask is done by imaging the ±1 diffraction orders from the phase grating mask onto the substrate using a half Dyson optical system. A plurality of half Dyson systems are generally used in parallel to pattern fine geom-
(Continued)

etry lines and spaces of a wire grid polarizer for a large area substrate. Each half Dyson system includes a primary mirror, a positive lens and a reticle.

19 Claims, 10 Drawing Sheets

(51) Int. Cl.
G03F 7/16 (2006.01)
G03F 7/09 (2006.01)
G02B 1/11 (2015.01)
G02B 5/30 (2006.01)
G03F 1/26 (2012.01)
G03F 7/20 (2006.01)
G03F 7/32 (2006.01)

(52) U.S. Cl.
CPC ............ G03F 1/26 (2013.01); G03F 7/0005 (2013.01); G03F 7/091 (2013.01); G03F 7/16 (2013.01); G03F 7/2002 (2013.01); G03F 7/322 (2013.01); G02F 2001/133548 (2013.01)

(58) Field of Classification Search
CPC .... G02B 5/3025; G02B 1/111; G02B 5/3041; G02B 27/283; G02B 27/286; G02B 5/3016; G02B 5/305; G02B 1/02; G02B 1/043; G02B 5/02; G02B 21/14; G02B 27/0006; G02B 27/0101; G02B 27/0172; G02B 5/0242; G02B 5/208; G02B 5/32; G02B 19/0028; G02B 19/0057; G02B 1/007; G02B 1/08; G02B 1/11; G02B 1/118; G02B 1/12; G02B 1/16; G02B 2027/0138; G02B 2027/0174; G02B 2027/0178; G02B 21/0032; G02B 2207/101; G02B 23/08; G02B 23/105; G02B 27/0988; G02B 27/1046; G02B 27/14; G02B 27/142; G02B 27/28; G02B 27/281; G02B 27/285; G02B 27/52; G02B 27/58; G02B 30/25; G02B 30/27; G02B 3/00; G02B 3/005; G02B 5/008; G02B 5/0215; G02B 5/0284; G02B 5/04; G02B 5/045; G02B 5/223; G02B 5/3008; G02B 5/3075; G02B 6/00; G02B 6/0053; G02B 6/0065; G02B 6/1226; G02B 6/2726; G02B 6/2793; G02B 6/29397; G02B 6/32; G02B 6/4203; G02B 6/4206; G02B 6/4208; G02B 6/4275; G02B 6/4296; G02B 5/0278; G02B 5/3058; G02B 1/10; G02B 2027/0112; G02B 5/0221; G02B 1/18; G02B 2027/011; G02B 2027/012; G02B 2027/0125; G02B 26/123; G02B 27/0081; G02B 27/01; G02B 27/0103; G02B 27/0905; G02B 27/0927; G02B 27/0944; G02B 27/145; G02B 27/48; G02F 1/133528; G02F 2201/50; G02F 2202/28; G02F 2001/133607; G02F 2202/40; G02F 1/133308; G02F 2001/133635; G02F 2413/11; G02F 2413/12; G02F 1/133502; G02F 1/133504; G02F 1/133526; G02F 1/133536; G02F 1/133608; G02F 1/13362; G02F 2001/133507; G02F 2001/133541; G02F 2001/133548; G02F 2202/023; G02F 2202/025; G02F 2202/22; G02F 2413/03; G02F 2413/04; G02F 2413/08; G02F 1/133634; G02F 1/13363; G02F 2001/133311; G02F 2001/133531; G02F 1/0136; G02F 1/0147; G02F 1/1303; G02F 1/133305; G02F 1/133533; G02F 1/134363; G02F 1/13439; G02F 1/1393; G02F 1/1396; G02F 2001/133302; G02F 2001/13332; G02F 2001/133325; G02F 2001/133331; G02F 2001/133357; G02F 2001/133637; G02F 2413/105; G03F 7/70566; G03F 7/70058; G03F 7/70191; G03F 7/70341
USPC ........................................................ 359/485
See application file for complete search history.

(56) References Cited

U.S. PATENT DOCUMENTS

| 6,545,808 | B1 * | 4/2003 | Ehbets ................. G02B 5/1857 |
| | | | 359/15 |
| 7,304,719 | B2 | 12/2007 | Albert et al. |
| 8,023,105 | B2 | 9/2011 | Sato et al. |
| 9,354,375 | B2 | 5/2016 | Tsuruoka |
| 9,766,492 | B2 | 9/2017 | Dong et al. |
| 2003/0086071 | A1 | 5/2003 | McGuire, Jr. |
| 2004/0169924 | A1 | 9/2004 | Flagello et al. |
| 2004/0227923 | A1 | 11/2004 | Flagello et al. |
| 2007/0165307 | A1 | 7/2007 | Perkins |
| 2008/0094547 | A1 | 4/2008 | Sugita et al. |
| 2013/0033659 | A1 | 2/2013 | Chung et al. |
| 2013/0153534 | A1 | 6/2013 | Resnick et al. |
| 2014/0176923 | A1 | 6/2014 | Hawryluk |

FOREIGN PATENT DOCUMENTS

| CN | 105339846 A | 2/2016 |
| EP | 1684099 A2 | 7/2006 |
| JP | H2181717 A | 7/1990 |
| JP | H4257801 A | 9/1992 |
| JP | 2003347185 A | 12/2003 |
| JP | 2004258670 A | 9/2004 |
| JP | 2009539123 A | 11/2009 |
| JP | 2015170780 A | 9/2015 |

OTHER PUBLICATIONS

Japanese Office Action dated Dec. 1, 2020 for Application No. 2018-546486.

* cited by examiner

WIRE GRID POLARIZER MANUFACTURING METHOD

BACKGROUND

Field

Embodiments of the present disclosure generally relate to flat panel display manufacturing processes. More specifically, systems and methods for manufacturing wire grid polarizers for liquid crystal displays are disclosed.

Description of the Related Art

A liquid crystal display (LCD) is a display that uses the light-modulating properties of liquid crystals sandwiched between crossed polarizers to display images. LCDs are used in a wide range of applications, including, but not limited to, high definition televisions, computer monitors and mobile devices. In a typical LCD, the liquid crystal cells are aligned between two linear polarizers, which are oriented orthogonally to one another.

Polarizing films have been used as the linear polarizers. The polarizing films allow light polarized perpendicular to the conductor lines of the polarizer to pass through, while reflecting the light polarized parallel to the conductor lines of the polarizer. However, polarizing films are very costly. In fact, polarizing films often account for more than 30% of the total cost of an LCD panel. Accordingly, wire grid polarization has been used to polarize the LCD. Wire grid polarization consists of directly patterning the glass substrate with a wire grid rather than applying additional films. Wire grid polarizers use an array of finely patterned wires, which is patterned onto the glass substrate, to selectively transmit light having an electric vector perpendicular to the grid lines while reflecting light having an electric vector in a parallel direction. However, fine patterning of a very large LCD panel is very challenging.

Therefore, there is a need in the art for systems and methods for generating wire grid polarizers for LCDs.

SUMMARY

The present disclosure generally relates to systems and methods for manufacturing wire grid polarizers for LCDs using interference lithography, which are also useful for generating large-area grating patterns. In one embodiment, a method includes depositing a bottom anti-reflective coating layer over an aluminum coated flat panel display substrate, depositing a photoresist layer over the bottom anti-reflective coating layer, and exposing the photoresist layer with an image from a phase grating mask. The exposure with the phase grating mask is done by imaging the ±1 diffraction orders from the phase grating mask onto the substrate using a half Dyson optical system. A plurality of half Dyson systems are generally used in parallel to pattern fine geometry lines and spaces of a wire grid polarizer for a large area substrate. Each half Dyson system includes a primary mirror, a positive lens and a reticle.

In one embodiment, a system for patterning a flat panel display is disclosed. The system includes a laser gage, a laser gage mirror and a plurality of half Dyson systems. Each half Dyson system includes a primary mirror, a positive lens, and a reticle.

In another embodiment, a method is disclosed. The method includes depositing an aluminum layer and then a bottom anti-reflective coating layer over a substrate, depositing a photoresist layer over the anti-reflective coating layer, patterning the photoresist layer using a phase grating mask, and imaging the ±1 diffraction orders from the phase grating mask onto the substrate. Patterning with the phase grating mask includes directing a laser illumination beam through an opening in the center of a primary mirror to a reticle and diffracting the laser illumination beam from the reticle to opposing areas near an edge of the primary mirror. The beams from the opposing areas are combined at the substrate and interfere to create a grating pattern having twice the spatial frequency as the grating on the phase grating mask.

In yet another embodiment, a method is disclosed. The method includes depositing a bottom anti-reflective coating layer over an aluminum coated substrate, depositing a photoresist layer over the bottom anti-reflective coating layer, patterning the photoresist layer with a first pattern by imaging two diffraction orders onto the substrate. Patterning the first pattern comprises directing a laser illumination beam through an opening in a center of a primary mirror to a reticle and diffracting the laser illumination beam from the reticle through refractive components to two opposing areas near an edge of the primary mirror. This is followed by a photoresist development operation, an etching operation and an operation that removes the remaining photoresist and anti-reflective coating layers. In this particular case the exposure and etching operations are arranged trenches in the aluminum coating that are one-quarter of the grating period on the substrate. Imaging the substrate comprises patterning the photoresist layer with a second identical pattern positioned so in the trenches created by the second identical pattern fall midway between the trenches of the first pattern. As with the first exposure the exposure and etch parameters are arranged to produce trenches that are about one-quarter of the period of the grating on the substrate. After the development, etching, and stripping operations, the result is a grid of fine aluminum lines having a grating period that is half of the period created by either exposure operation.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

The present disclosure generally relates to systems and methods for manufacturing wire grid polarizers for LCDs using interference lithography, which are also useful for generating large-area grating patterns. In one embodiment, a method includes depositing a bottom anti-reflective coating layer over an aluminum coated flat panel display substrate, depositing a photoresist layer over the bottom anti-reflective coating layer, and exposing the photoresist layer with an image from a phase grating mask. The exposure with the phase grating mask is done by imaging the ±1 diffraction orders from the phase grating mask onto the substrate using a half Dyson optical system. A plurality of half Dyson systems are generally used in parallel to pattern fine geometry lines and spaces of a wire grid polarizer for a large area substrate. Each half Dyson system includes a primary mirror, a positive lens and a reticle.

Figure 1:
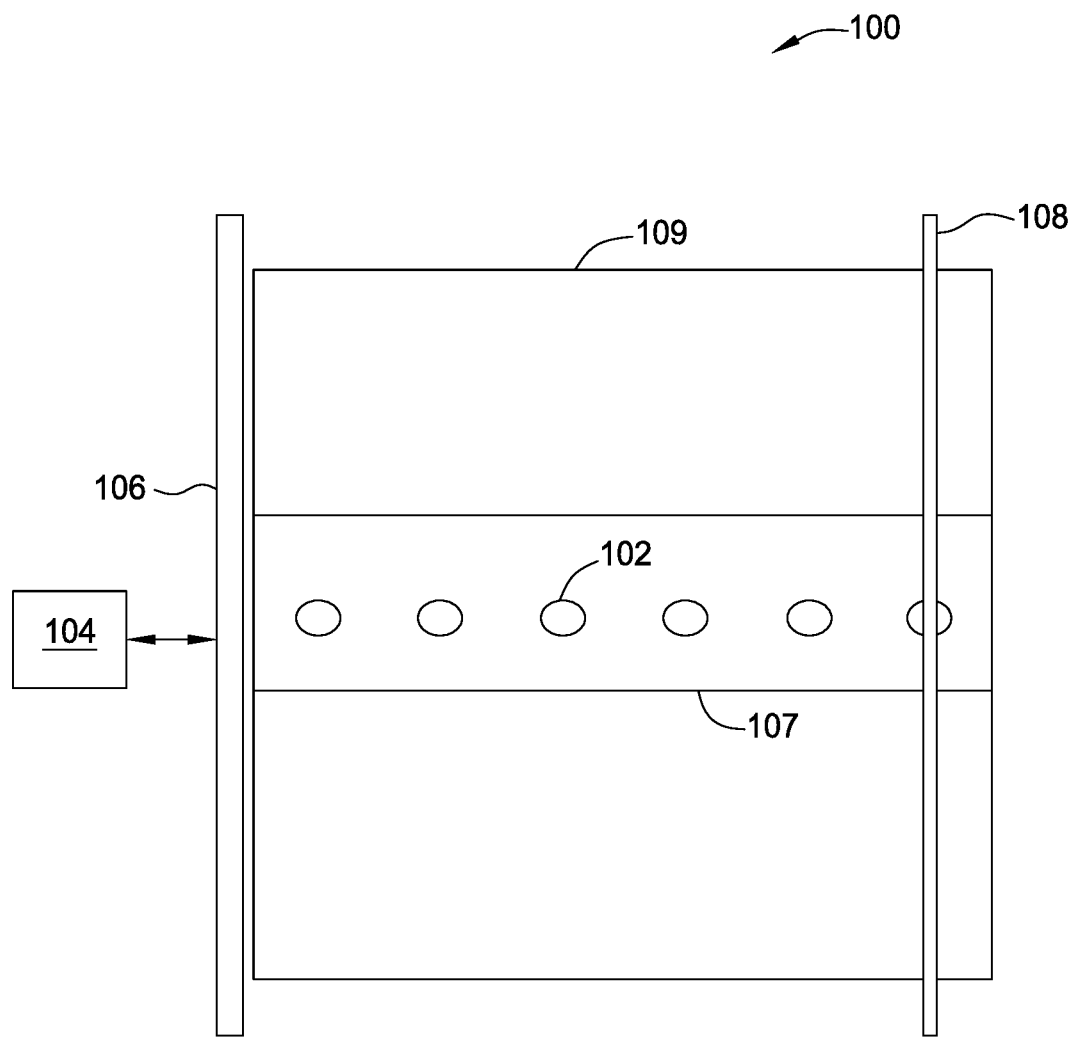
FIG. 1 is a lithography system for printing a wire grid polarizer pattern onto a flat panel display substrate.

FIG. 1 is a system 100 for printing a wire grid polarizer pattern onto a flat panel display substrate. The system 100 includes a plurality of half Dyson systems 102 (six are shown), a laser gage 104, a laser gage mirror 106 and a substrate stage 109. The plurality of half Dyson systems 102 may be evenly distributed across the width of the substrate stage 109, which is configured to support a large area substrate. For example, when the system 100 is configured for patterning a Gen 8 flat panel display, having a width of about 2200 millimeters (mm) and a length of about 2500 mm, the spacing between each of the half Dyson systems 102 may be about 367 mm. The system 100 may be configured to pattern Gen 8, Gen 10 and future generation flat panel display substrates.

As shown in FIG. 1, the system 100 has six half Dyson systems 102 corresponding to six columns across the width of the flat panel display substrate. In use, each column may operate in parallel to write a 13.3 mm wide scan path 108 of the flat panel display substrate. The half Dyson systems 102 may be disposed on bridge 107, which is spaced above a substrate stage 109, as shown in FIG. 1.

Figure 2A:
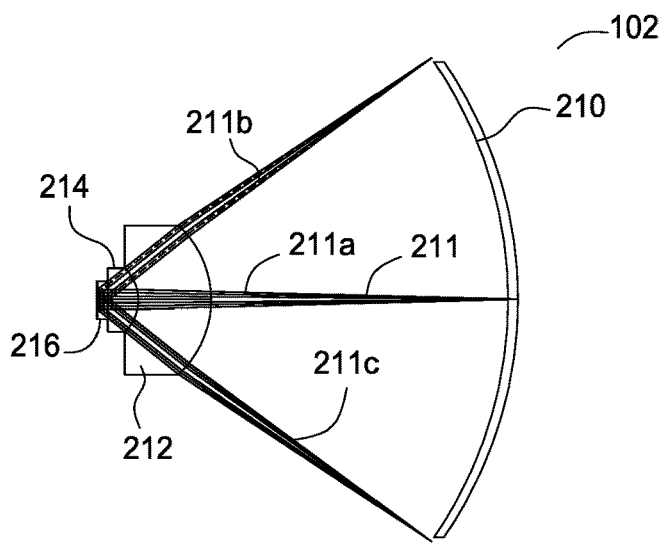
FIG. 2A is a half Dyson system of the system of FIG. 1.
Figure 2B:
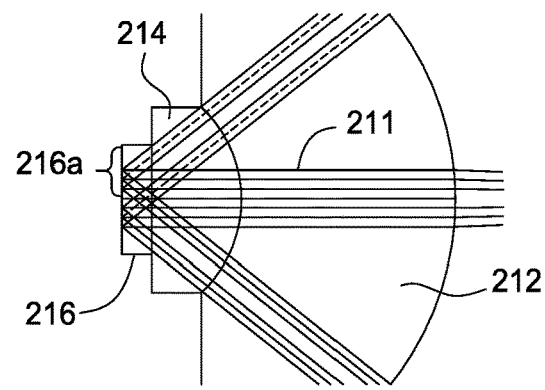
FIG. 2B is an enlarged view of a portion of the half Dyson system of FIG. 2A.
Figure 2C:
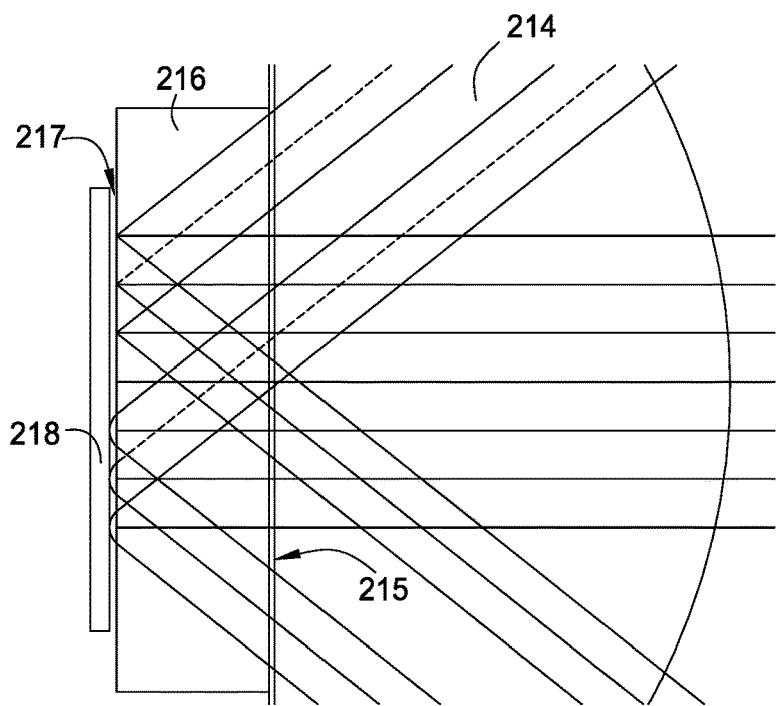
FIG. 2C is an enlarged view of a portion of the portion of the half Dyson system of FIG. 2B.

FIG. 2A is a half Dyson system 102 of the system 100. The half Dyson system 102 includes a primary mirror 210, a positive lens 214, a meniscus lens 212, and a reticle 216. The primary mirror 210 may be a weakly aspheric mirror. The positive lens 214 may be a glass lens or it may be made from a fused silica, calcium difluoride (CaF$_2$) crystal, or any other suitable material. The reticle 216 may have a height of between about 10 mm and about 20 mm, for example 14 mm, and a thickness of between about 1 mm and about 6.35 mm, for example, about 2.286 mm. FIG. 2B is an enlarged view of a portion of the half Dyson system 102 of FIG. 2A. FIG. 2C is an enlarged view of a portion of the portion of the half Dyson system 102 of FIG. 2B. As shown in FIG. 2C, a flat panel display substrate 218 may be positioned adjacent to the reticle 216. The flat panel display substrate 218 is separated from the reticle 216 by a first air gap 217. The first air gap 217 may have a width of between about 0.1 mm and about 0.5 mm, for example, about 0.25 mm. The reticle 216 may be separated from the positive lens 214 by a second air gap 215 or it may be optically coupled with an optical gel or optical cement or any other suitable material. The second air gap 215 may have a width of between about 0.1 mm and about 0.5 mm, for example, about 0.25 mm. The second air gap 215 may also be filled with an optical gel or optical cement or any other suitable material. For example, a suitable material may have an index of refraction that matches the optical materials on either side at the exposure wavelength.

Figure 3:
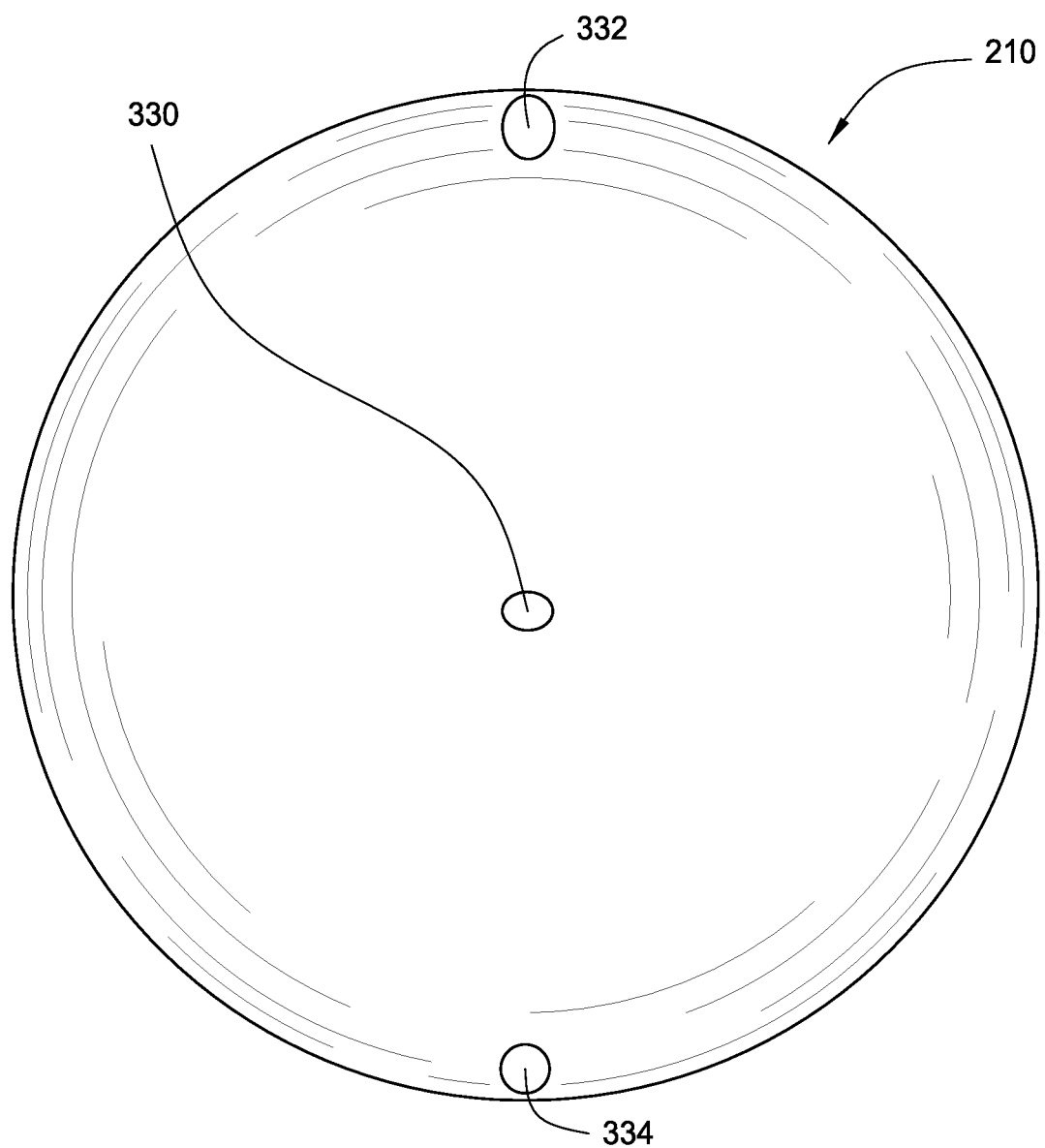
FIG. 3 is a plan view of a primary mirror, which may be used in the half Dyson system of FIG. 2A.

FIG. 3 is a plan view of the primary mirror 210, which may be used in the half Dyson system 102. The primary mirror 210 may include an opening 330, which is centrally located, and through which the illumination beam 211 on the mask emerges and which is collimated on the reflective, phase grating mask to generate ±1 diffraction orders 211*b* and 211*c* to occupy the area 332 located at the top edge, or a first side, of the primary mirror 210, and an area 334 located at the bottom edge, or opposite side, of the primary mirror 210. The ±1 diffraction orders 211*b* and 211*c* from the grating in the object plane may ultimately be imaged just below the object plane on an opposite side of an optical axis. The zero diffraction order 211*a*, which should have a relatively small intensity, passes back through the opening 330 in the primary mirror 210. The zero diffraction order 211*a* is not imaged. In other words, the zero diffraction order 211*a* is eliminated, which results in doubled frequency of grating lines to be imaged. The distance between the vertex of the primary mirror 210 and the substrate may be between about 50 mm and about 500 mm, for example, about 85 mm. Larger optical systems yield larger field sizes and therefore require fewer columns to span a given field, but each optical system costs more. Thus, the field size may be a question of economics. The field size of the system shown in FIGS. 1 and 2A-2C is about 2 mm by about 13.3 mm and the numerical aperture (NA) is 0.8875, which is high for such an optical system. Increased NA is made possible because a very small portion of the primary mirror 210 is used, which improves the results of the design optimization process.

Figure 4:
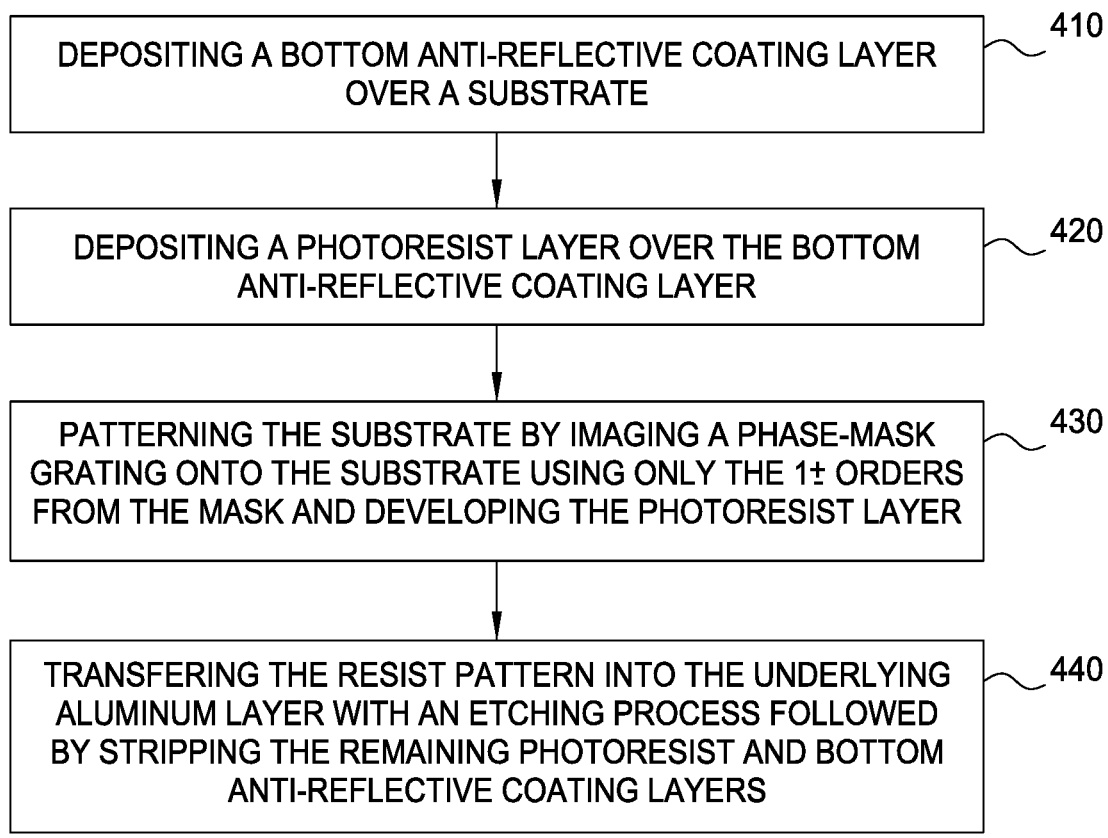
FIG. 4 is a flow diagram summarizing a method according to one embodiment.

FIG. 4 is a flow diagram summarizing a method, 400, according to one embodiment. FIGS. 5A-5E depict schematic sectional side views of stages of fabrication of a wire grid polarizer on a flat panel display substrate 218 according to embodiments described herein.

Figure 5A:
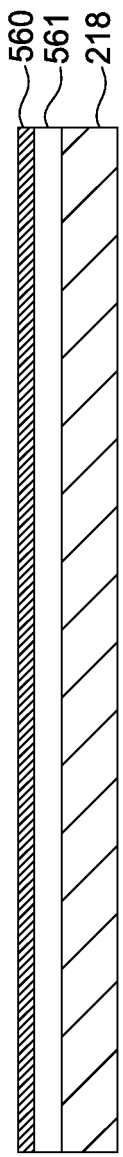
FIGS. 5A-5I depict schematic sectional side views of stages of fabrication of a wire grid polarizer on a flat panel display substrate according to embodiments described herein.

The method 400, shown in FIG. 4, begins at operation 410 by depositing a bottom anti-reflective coating (BARC) layer 560 over flat panel display substrate 218, which may have an aluminum coating 561, as shown in FIG. 5A. The BARC layer 560 may be deposited on and in contact with the aluminum-coated flat panel display substrate 218. The BARC layer 560 may include any suitable BARC material(s). The BARC layer 560 may include a material which absorbs 355 nm light and is transparent to 400 nm and above light, such that the BARC layer 560 may remain in place throughout the method 400 until photoresist layer 562, discussed below, is stripped away from an etched line pattern. Deposition of the BARC layer 560 provides for control of the critical dimension (CD) across the surface of the flat panel display substrate 218.

Figure 5B:
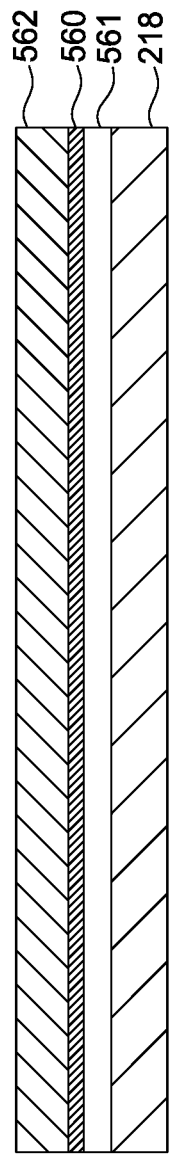

At operation 420, a photoresist layer 562 is deposited over the BARC layer 560, as shown in FIG. 5B. The photoresist layer 562 may be deposited on and in contact with the BARC layer 560. The photoresist layer 562 may include any suitable photoresist material(s).

At operation 430, two diffraction orders, ±1 diffraction orders, from a phase grating mask are projected from in a first portion 216a of the reticle 216 onto the substrate 218, as shown in FIG. 2B. Specifically, a laser illumination beam 211 is projected through the opening 330 of the primary mirror 210, as shown in FIGS. 2A and 2B. The opening 330 in the primary mirror 210 is in the same location as where the zero diffraction order 211a would fall, thus preventing any zero diffraction order from reaching the substrate. By eliminating the zero diffraction order, the frequency of the grating lines to be imaged is doubled. The laser may be a commercially available 16 watt (W)/355 nanometer (nm) lasers. The laser illumination beam 211 passes through the primary opening 330, and through the positive lens 214 to create a normally incident, collimated beam on the reticle 216.

More particularly, the laser illumination beam 211 diffracts from the bottom surface of the reticle 216, where the phase grating mask is located, and the ±1 diffraction orders 211b and 211c proceed to the two areas 332 and 334 on opposite sides near the edge of the primary mirror 210 as shown in FIG. 2. On reflection from the primary mirror and after passing through the refractive components a second time the ±1 diffraction orders 211b and 211c are collimated and superimposed where they interfere to form a fringe pattern on the substrate 218 having twice the spatial frequency as the grating pattern on the reticle 216.

Figure 5C:
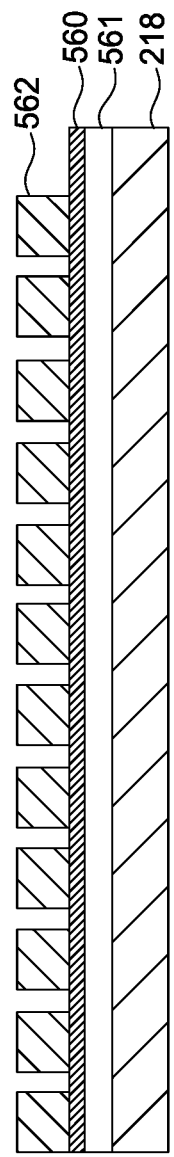
Figure 5D:
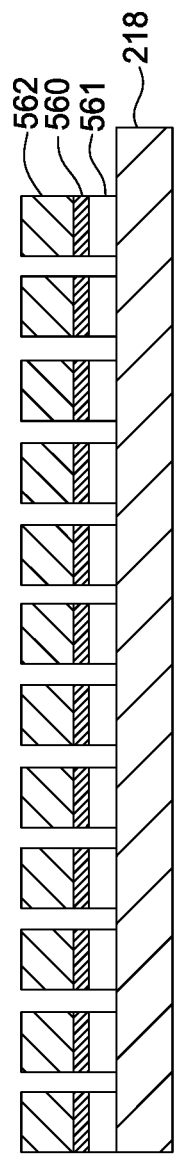
Figure 5E:
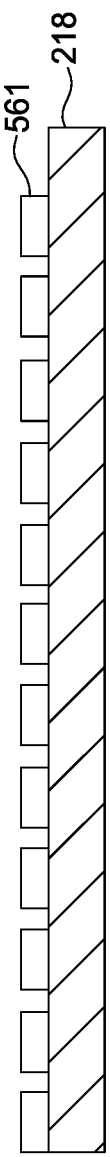
Figure 5F:
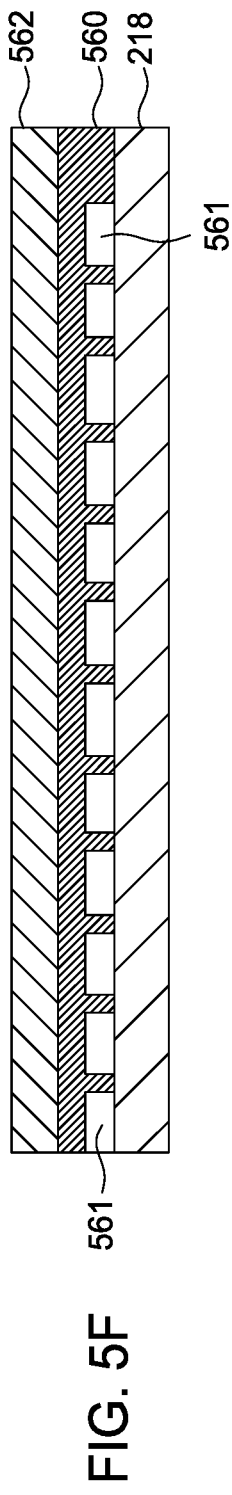
Figure 5G:
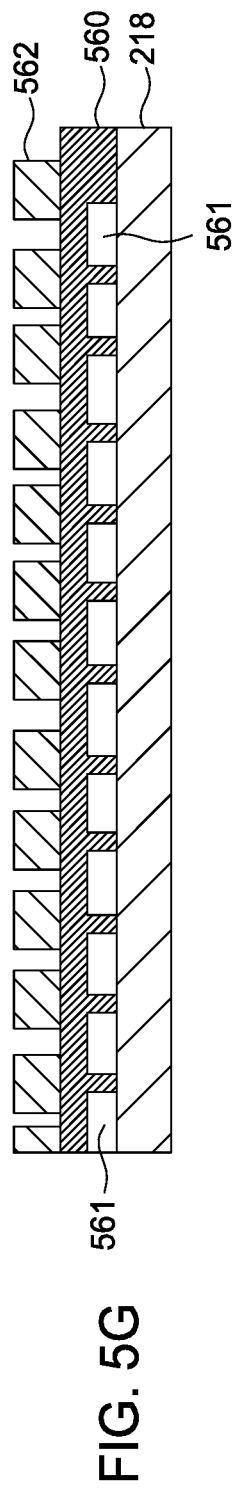
Figure 5H:
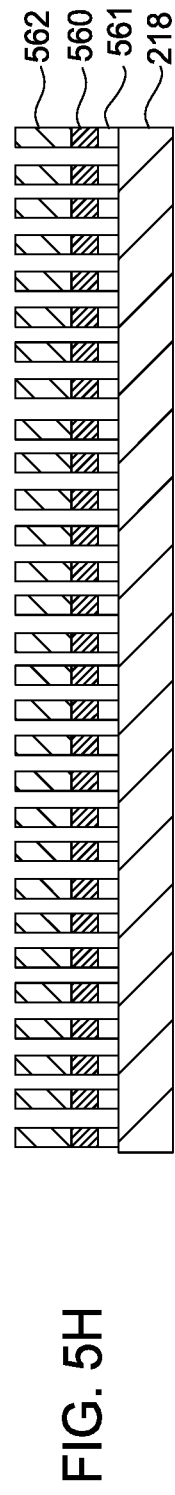
Figure 5I:
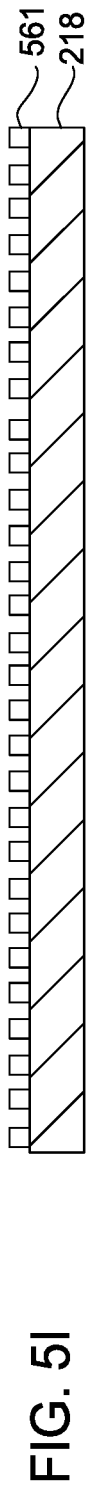

After the flat panel display substrate 218 has been imaged, the photoresist layer 562 of the flat panel display substrate 218 is developed to reveal the grating pattern. The method 400 further includes operation 440 transferring the resist pattern into the aluminum layer and stripping away the resist and antireflection layers, After stripping away the photoresist layer 562 and the BARC layer 560, all that remains is a fine grid of aluminum wires 561 on the substrate. The patterned photoresist layer 562 is illustrated in FIG. 5C, the pattern transfer operation in FIG. 5D, and the resulting grid of aluminum wires 561 in FIG. 5E.

Because an array of, for example evenly distributed, Dyson systems 102 are employed in the system 100, the flat panel display substrate 218 is scanned under the half Dyson systems 102 using the substrate stage 109 and, at the end of scan, the flat panel display substrate 218 and is stepped in an orthogonal direction and scanned in the opposite direction and so on to image a phase grating pattern over the entire flat panel display substrate 218.

In one example, when the system 100 is used to perform the method 400 for patterning a Gen 8 substrate, the scan path 108 may have a width of about 13.3 mm. In order to pattern the entire substrate, at least about 30 scans must be performed. Scanning occurs by moving the substrate stage 109 under the plurality of half Dyson systems 102. The laser gage 104 uses the laser gage mirror 106 as a reference to precisely set and maintain the stepping distance to an integral number of fringes. Ideally the optical axis of the half Dyson systems 102 and the axis of the laser illumination beam should be arranged along a straight line on the substrate surface to minimize Abbe offset errors. The scan speed may be limited by the maximum stage velocity. The maximum stage velocity may be between about 0.1 meters/second (m/s) and about 3 m/s, for example about 2 m/s. Each scan may take about 1.66 seconds. Therefore, it may take about 49.8 seconds to scan and pattern an entire Gen 8 substrate.

The etched line width to grating period ratio can be reduced to about a 1:4 ratio by varying the exposure dose and etching system parameters. This leaves room in the remaining oversized aluminum lines to interleave a second exposure and etching operation that halves the resulting grating period. After the first pattern has been exposed, developed and etched then, operations 410 through 440 may be repeated to interleave a second identical pattern on the flat panel display substrate 218 with a second exposure.

The second exposure may be combined with a very slight adjustment of the image position so that the etch operation is centered on each of the aluminum wires 561 generated with the first exposure. This is illustrated in FIGS. 5F to 5I. For example, after the method 400 has been completed once, the flat panel display substrate 218 may have 150 nm lines with a 200 nm pitch. The substrate position for the second exposure would be, offset from the first position by 100 nm. After operations 430 and 440 have been repeated using the same phase grating mask, the flat panel display substrate 218 would have an equal line and space pattern having a 100 nm period.

The width of the trenches created in the aluminum layer depends on the resist parameters, the exposure dose and the etching parameters. For example if a positive acting resist is used, then a smaller exposure dose and a less aggressive etch may be used to achieve narrower trenches.

Figure 6:
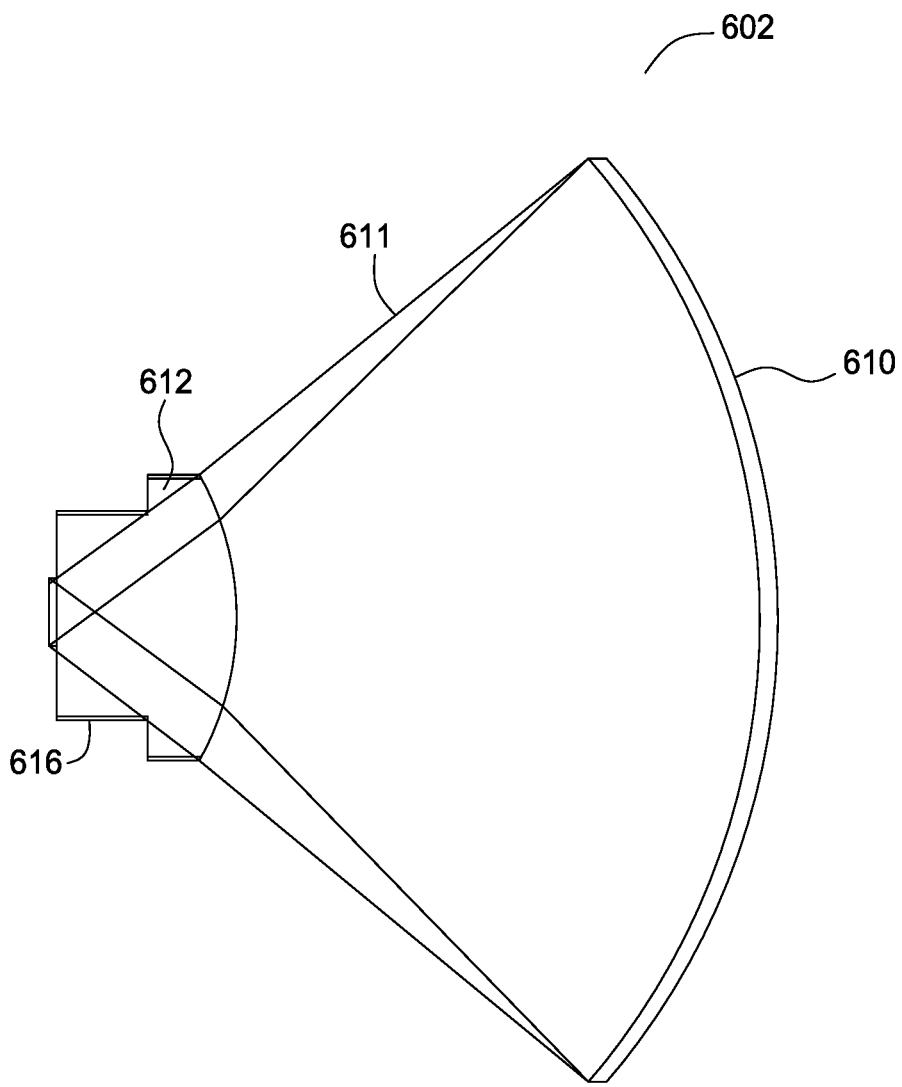
FIG. 6 is a half Dyson optical system of the system of FIG. 1 according to another embodiment.

FIG. 6 is a half Dyson system 602 which may be used in the system 100 according to another embodiment. The half Dyson system 602 includes a primary mirror 610, a positive lens 614, and a reticle 616. The primary mirror 610 may be a weakly aspheric mirror. The positive lens 614 may be a glass lens. The reticle 616 may have a height of between about 10 mm about 20 mm, for example 14 mm, and a thickness of between about 1 mm and about 6.35 mm, for example, about 2.286 mm. Laser illumination beam 611 passes through the through the positive lens 614 to create a normally incident, collimated beam incident on the reticle 616.

While the above embodiments contemplate use of the process for manufacturing polarizers, the process disclosed may also be used for manufacturing gratings which have found a wide variety of applications including metrology and high-power laser beam compression and stretching. Further, the methods and systems described herein may be used in conjunction with self-aligning imprint lithography (SAIL). SAIL processes have high-throughput and high-yield, and are more cost-efficient. SAIL includes a three operation process flow consisting of material deposition, imprinting with a mask and etching. Specifically, the methods and systems may be used to form the phase grating of SAIL masks or SAIL may be used to form the phase grating of the methods described herein.

It is another object of the present disclosure to provide uniform illumination across the field. The laser illumination beam 211 is Gaussian shaped. In order to provide a uniform exposure dose across the field, the Gaussian shape of the laser illumination beam 211 may be used to illuminate a grating in which the lines vary in length depending on the intensity of the illumination beam at that point.

Figure 7:
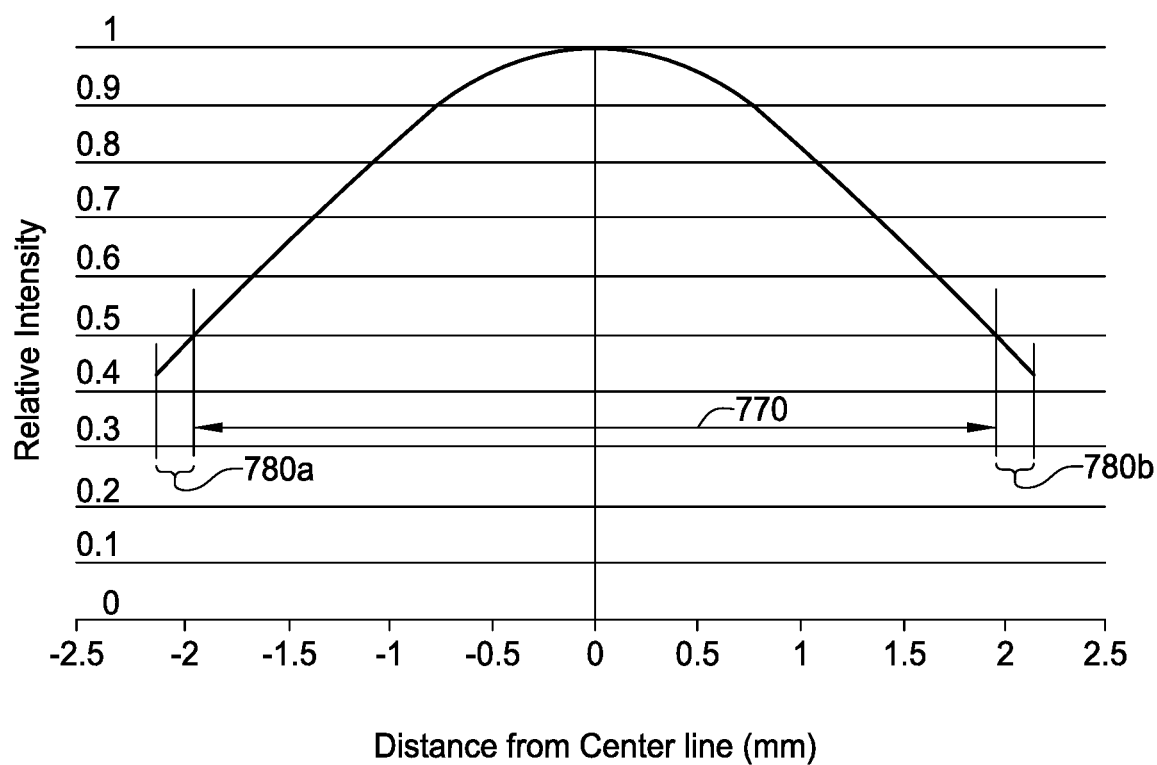
FIG. 7 is a graph illustrating an intensity profile of a diffraction limited laser illumination beam along a length of a phase grating mask.

FIG. 7 is a graph illustrating a Gaussian profile of a laser illumination beam 211 along a grating length. Portion 770 of the curve represents the portion of the laser illumination beam 211 that is not overlapped with the adjacent beam. End portions 780a and 780b represent portions of the curve that are overlapped with the adjacent beam. The exposure dose of end portions 780a and 780b are linearly tapered from 100% to 0% so overlapping exposures result in a uniform dose in the overlapped area. Tapering the end portions 780a and 780b provides for overlapping exposure doses that appear to be seamless, because small overlap errors do not generate abrupt exposure differences.

Figure 8:
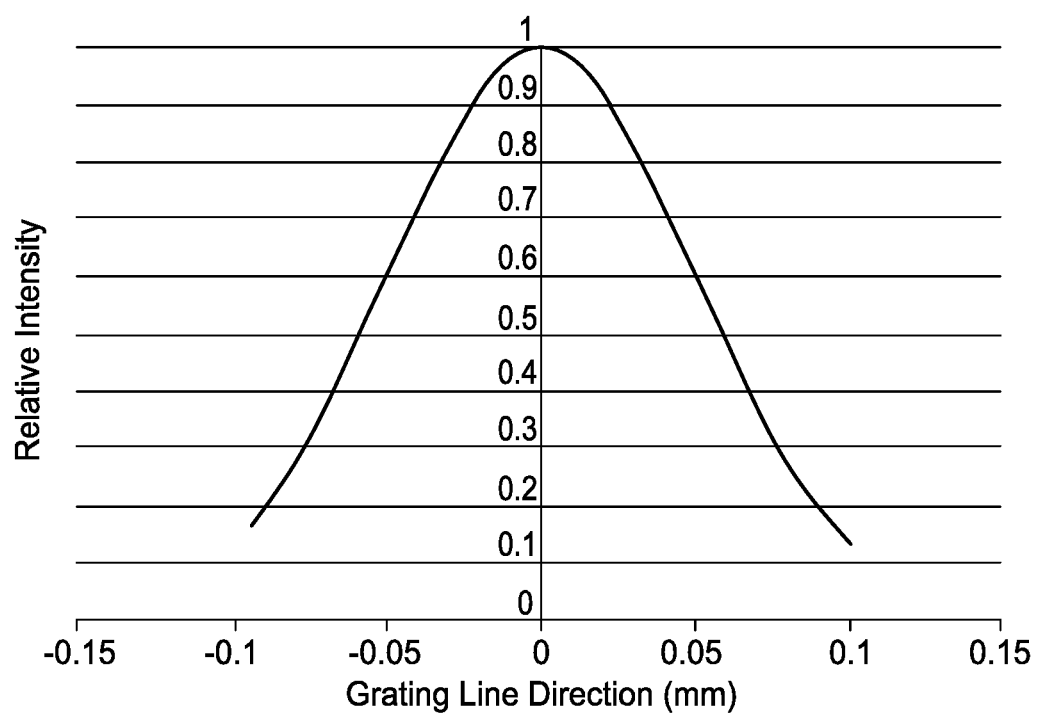
FIG. 8 is a graph illustrating an intensity profile the laser illumination beam along a grating line of the phase grating mask.

FIG. 8 is a graph illustrating a profile of a laser illumination beam 211 along a grating line. More particularly, FIG. 8 illustrates the profile of the laser illumination beam 211 at the longest grating line at that profile.

Figure 9:
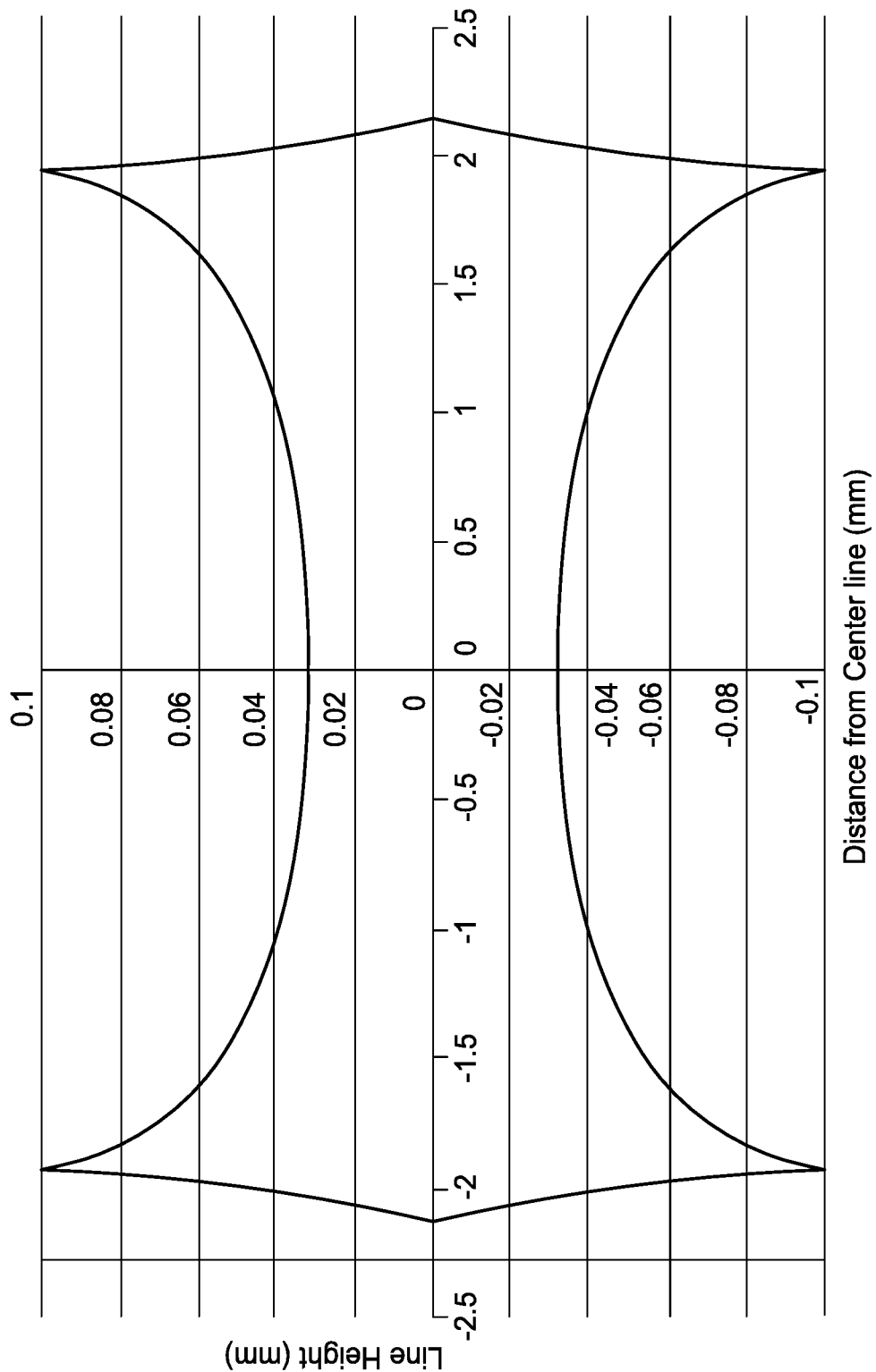
FIG. 9 is a graph illustrating the variation in grating line height with distance from a center line on the phase grating mask.

FIG. 9 is a graph illustrating the variation in grating line height (or length) with distance from a center line. In order to control exposure dose, the laser illumination beam 211 is most intense in the center, so the grating lines closest to the center are shorter, or have less height, for example about 0.03 mm. As you move along the grating towards the edge of the field, the length of the grating lines may get progressively longer, or the height may increase, for example about 0.1 mm long. Varying the length of the grating line inversely to the integrated intensity of the laser illumination beam 211, as shown in FIGS. 7-8, results in providing the same exposure dose across the field. The exposure dose is the integrated intensity over the time a point on the substrate is exposed. Exposure time is proportional to the length, or height, of the grating line.

By changing the lengths of the grating lines across the field as shown in FIGS. 7-9, the exposure dose over the substrate may be controlled. More particularly, the variation of the lengths of the grating lines across the field results in a uniform exposure dose from one end of the grating to the other despite the fact that the laser illumination beam 211 has a very non-uniform, Gaussian shape.

While the foregoing is directed to embodiments of the present disclosure, other and further embodiments of the disclosure may be devised without departing from the basic scope thereof, and the scope thereof is determined by the claims that follow.

What is claimed is:

1. A system for patterning a flat panel display, comprising:
   a laser gage;
   a laser gage mirror; and
   a plurality of half Dyson systems, wherein each half Dyson system comprises:
      a primary mirror;
      a positive lens; and
      a reticle containing a grating that includes a grating line pattern that comprises:
         a center line; and
         a plurality of grating lines, each grating line having a length indicating a size of that grating line and each grating line being positioned at a distance from the center line, wherein the lengths of the plurality of grating lines increase for each grating line as the distance from the center line increases to a point a distance away from the center line.

2. The system of claim 1, wherein the positive lens comprises fused silica or calcium difluoride.

3. The system of claim 1, wherein the primary mirror reflects ±1 diffraction orders from a grating in an object plane.

4. The system of claim 1, further comprising:
   a meniscus lens; and
   a substrate stage.

5. The system of claim 4, further comprising a bridge, the bridge being spaced above the substrate stage and having the plurality of half Dyson systems disposed thereon.

6. The system of claim 1, wherein the primary mirror has an opening in a center for providing access to an illumination beam.

7. The system of claim 6, wherein the illumination beam illuminates an object grating with collimated light and provides a means of eliminating any zero order diffraction.

8. A method, comprising:
   depositing a bottom anti-reflective coating layer over a substrate having an aluminum coating thereon;
   depositing a photoresist layer over the bottom anti-reflective coating layer;
   patterning the substrate by imaging a phase grating mask onto the substrate, wherein
      the phase grating mask includes a grating line pattern that comprises:
         a center line; and
         a plurality of grating lines, each grating line having a length indicating a size of that grating line and each grating line being positioned at a distance from the center line, wherein the lengths of the plurality of grating lines increase for each grating line as the distance from the center line increases to a point a distance away from the center line, and
      patterning the substrate comprises:
         directing a laser illumination beam through an opening of a primary mirror to a reticle containing the phase grating mask; and
         diffracting the laser illumination beam from the reticle to opposing areas near edges of the primary mirror; and
   imaging ±1 diffraction orders onto the substrate.

9. The method of claim 8, wherein the bottom anti-reflective coating layer is deposited on and in contact with the aluminum coating.

10. The method of claim 8, wherein the bottom anti-reflective coating layer comprises a material which absorbs 355 nm light and is transparent to 400 nm and above light.

11. The method of claim 8, further comprising:
    developing the photoresist layer.

12. The method of claim 8, further comprising:
    performing aluminum etching over the substrate.

13. The method of claim 8, wherein the photoresist layer is deposited on and in contact with the bottom anti-reflective coating layer.

14. The method of claim 8, further comprising developing the photoresist layer.

15. The method of claim 14, further comprising performing aluminum etching over the substrate to form a first pattern of narrow grooves over the substrate.

16. The method of claim 15, further comprising repeating the depositing a bottom anti-reflective coating layer over an aluminum coated substrate, the depositing a photoresist layer over the bottom anti-reflective coating layer, and the patterning the substrate by imaging a phase grating mask onto the substrate to form a second pattern of narrow grooves over the substrate.

17. A grating line pattern, comprising:
    a center line; and
    a plurality of grating lines, each grating line having a height and a length, the height and length indicating a size of that grating line and each grating line being positioned at a distance from the center line, wherein the lengths of the plurality of grating lines increase for each grating line as the distance from the center line increases to a point a distance away from the center line.

18. The grating line pattern of claim 17, wherein the length of a grating line proximal to the center line is less than the length of a grating line distal to the center line.

19. The grating line pattern of claim 18, wherein the length of the grating line is inversely proportional to an intensity of a laser illumination beam having a Gaussian-shaped intensity profile, and wherein the length of the grating line is proportional to a time of exposure to a laser illumination beam.

\* \* \* \* \*